United States Patent [19]
Brown et al.

[11] Patent Number: 5,835,786
[45] Date of Patent: Nov. 10, 1998

[54] COMPUTER APPARATUS WITH MONITORING CIRCUIT FOR DISPLAYING FAN WORKING CONDITION

[75] Inventors: Robert L. Brown, Pleasant Hill; Techeng Lin, Fremont, both of Calif.

[73] Assignee: Micronics Computers Inc., Fremont, Calif.

[21] Appl. No.: 652,986

[22] Filed: May 24, 1996

[51] Int. Cl.$^6$ .......................... G06F 13/20; G06F 15/20; H02H 5/04

[52] U.S. Cl. ............... 395/835; 395/750.03; 395/750.08; 395/838; 361/103; 361/685; 361/684; 340/635; 340/584; 454/184

[58] Field of Search ..................... 340/635, 584; 361/684, 685, 103; 454/184; 364/484; 395/750.03, 750.08, 835, 838

[56] References Cited

U.S. PATENT DOCUMENTS

| | | | |
|---|---|---|---|
| 5,483,102 | 1/1996 | Neal et al. | 257/712 |
| 5,555,158 | 9/1996 | Dent | 361/684 |
| 5,631,800 | 5/1997 | Jin et al. | 361/103 |
| 5,673,029 | 9/1997 | Behl et al. | 340/635 |

*Primary Examiner*—Thomas C. Lee
*Assistant Examiner*—Rehana Perveen
*Attorney, Agent, or Firm*—Paul Hentzel

[57] ABSTRACT

Computer apparatus 10 provides the working condition of fan 12 therein to user display device 10D. Fan 12 has rotating blade 12B for moving a flow of convective cooling air. The fan also has motor winding 12W which receives working current for causing the blade to rotate. Current monitoring circuit 14 is responsive to the working current for determining the present fan working condition. Display message generator 16 is responsive to the present fan working condition from the current monitoring circuit for generating a user message containing the present fan working condition. A central processing unit (CPU chip) 10C controls the operation of the computer apparatus. The CPU employs a multi-task operating system such as 3.1 windows which permits non-disruptive interruption of system functions in order to the present user message containing the present fan working condition to the user display monitor. The operating system polls the display message generator at predetermined time intervals in order to capture the present fan working condition. If the user message indicates a normal fan working condition, the operating system resets a timer. If the user message indicates an abnormal fan working condition such as underload or overload, the operating system displays the message. The data forming the user message may have a conventional raster scan format for presentation to the user display device. User display device 10D is responsive to the display message generator for displaying the user message. The user message alerts the user to the present fan working condition.

22 Claims, 4 Drawing Sheets

COMPUTER APPARATUS WITH MONITORING CIRCUIT FOR DISPLAYING FAN WORKING CONDITION

TECHNICAL FIELD

This invention relates to monitoring of the working current of the fan within a computer apparatus, and more particularly to such monitoring with presentation of the fan working condition to a user.

BACKGROUND

New chip designs have vastly increased memory arrays and operate at much higher clock speeds. These recent features produce an enormous increase in transient current each clock cycle which causes severe heat dissipation problems. The excess heat may be removed by a small fan mounted directly on the chip. A catastrophic event such as an open (or short) in the motor winding, results in immediate fan failure. The chip overheats with possible self destruction. Slow ageing may also lead to fan failure. Dust collection and bearing wear incrementally add to the rotation resistance. As rpm drops, the working current increases. The maximum torque of a d.c motor occur at zero rpm. Eventually the high current burns-out the ageing fan which causes an open (or short) in the winding.

SUMMARY

It is therefore an object of this invention to provide a fan current monitoring circuit for determining the fan working condition.

It is another object of this invention to present the determined fan working condition to the user.

It is another object of this invention to present the fan working condition without interrupting the system function.

It is a further object of this invention to provide a monitor circuit for a plurality of fans.

It is a further object of this invention to provide a monitor circuit which presents multiple fan working conditions.

Briefly, these and other objects of the present invention are accomplished by providing a computer apparatus which presents fan working conditions to a user display monitor. A housing encloses the computer apparatus. A mother board within the housing supports the components of the computer apparatus. A fan moves a flow of convective cooling air over the mother board throughout the housing. The motor winding within the fan receives working current from a power supply for energizing the fan. A current monitoring circuit on the mother board is responsive to the working current for determining the present fan working condition. A display message generator is responsive to the present fan working condition from the current monitoring circuit for providing raster scan data forming a user message containing the present fan working condition. A central processing unit (CPU) operates the computer apparatus, employing a multi-task operating system which permits non-disruptive interruptions of system functions in order to present user message containing to a user display monitor.

BRIEF DESCRIPTION OF THE DRAWING

Further objects and advantages of the present current monitoring circuit and the operation of voltage comparator therein will become apparent from the following detailed description and drawing (not drawn to scale) in which.

Figure 1:
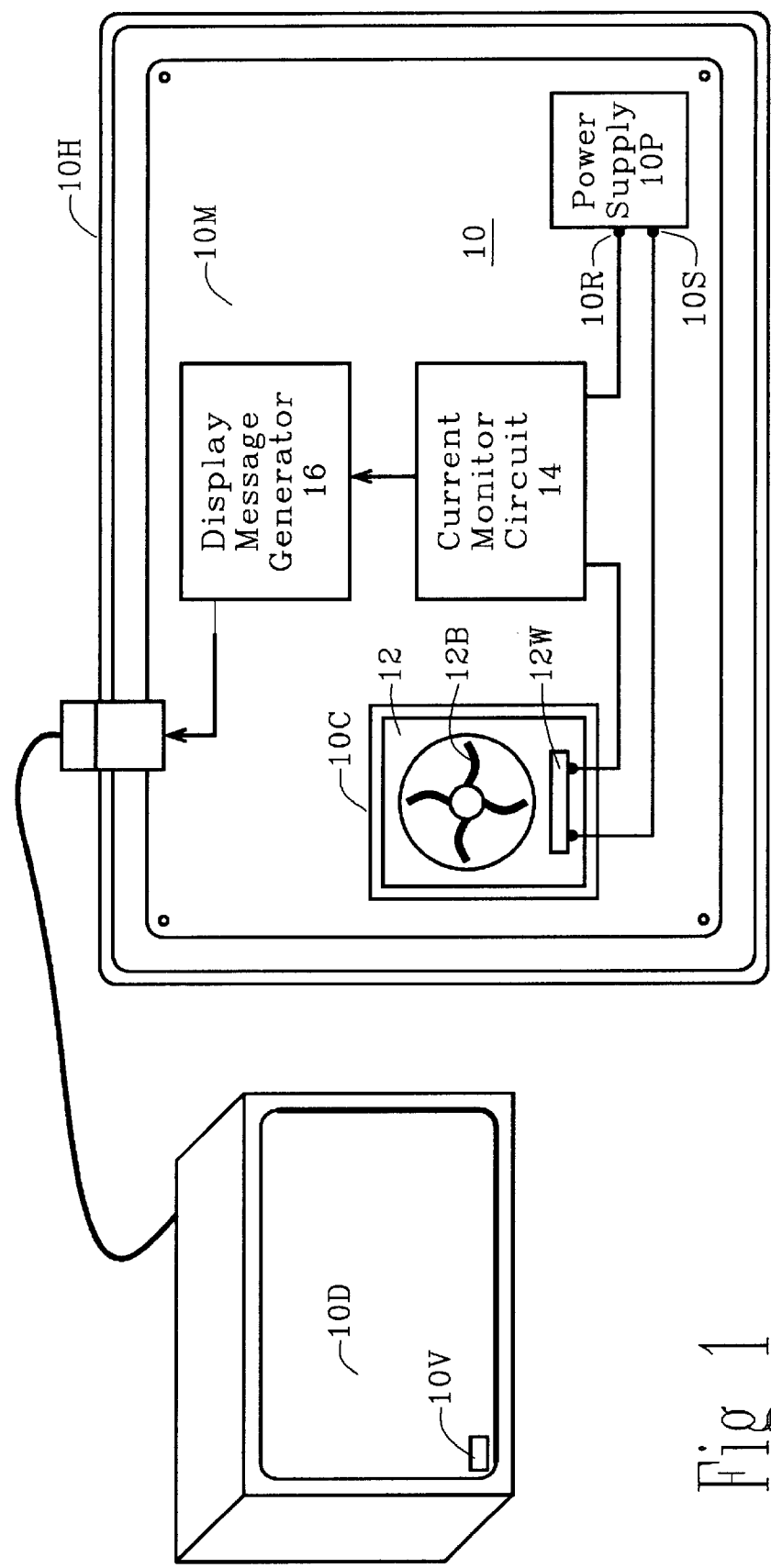
FIG. 1 is a plan view of a general embodiment showing the components of the computer apparatus and a user display device.

The elements of the invention are designated by two digit reference numerals in the above figures. The first digit indicates the figure in which that element is first disclosed or is primarily described. The second digit indicates like features and structures throughout the figures. Some reference numerals are followed by a letter which indicates a sub-portion or related feature of that element.

GENERAL EMBODIMENT—FIG. 1

Computer apparatus 10 provides the operational status or working condition of fan 12 therein to user display device 10D. Housing 10H encloses the computer apparatus. Mother board 10M within the housing supports the circuit components of the computer apparatus. Fan 12 has rotating blade 12B for moving a flow of convective cooling air over the mother board throughout the housing. The fan also has motor winding 12W which receives working current for causing the blade to rotate. The working current for energizing the fan may be from any suitable source of electrical power such as 12 volt d.c power supply 10P. The power supply has a supply terminal 10S and a return terminal 10R. Supply terminal 10S supplies the working current from the power supply to the motor winding. Return terminal 10R returns the working current from the motor winding to the power supply.

Current monitoring circuit 14 on the mother board is responsive to the working current for determining the present fan working condition. In the embodiment of FIG. 1, the current monitoring circuit is connected in the return side of the power supply between the motor winding and the return terminal. Display message generator 16 is responsive to the present fan working condition from the current monitoring circuit for generating a user message containing the present fan working condition. A central processing unit (CPU chip) 10C controls the operation of the computer apparatus. In the embodiment of FIG. 1, the fan is mounted directly on the CPU chip for more effective heat removal from the chip.

Figure 4:
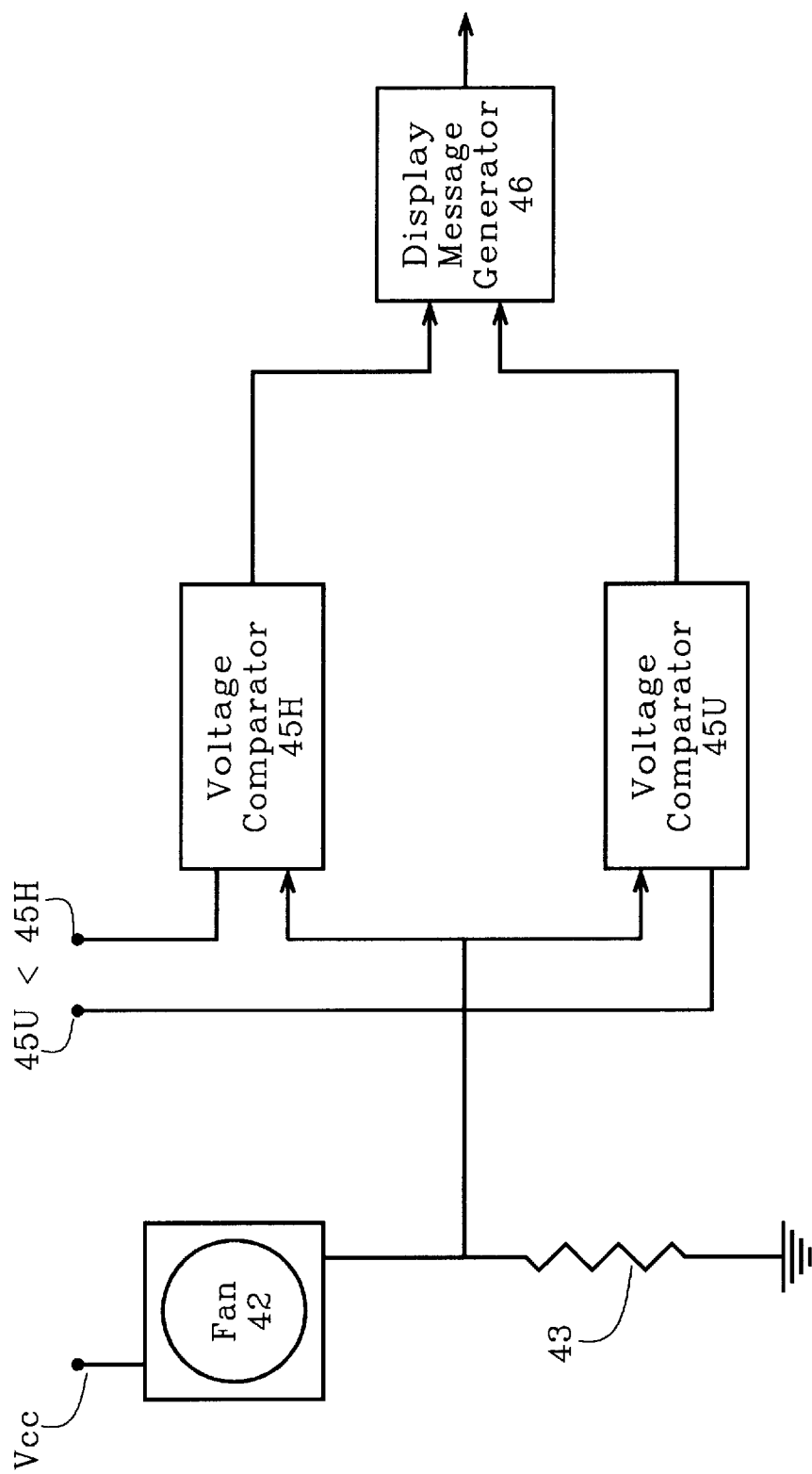
FIG. 4 is an embodiment having three working conditions for the fan, a normal condition, an underload condition, and an overload condition.

The CPU employs a multi-task operating system such as 3.1 windows which permits non-disruptive interruption of system functions in order to the present user message containing the present fan working condition to the user display monitor. The operating system polls the display message generator at predetermined time intervals (every ten seconds for example) in order to capture the present fan working condition. If the user message indicates a normal fan working condition, the operating system resets a ten second timer. If the user message indicates an abnormal fan working condition such as underload or overload (see section entitled "Two Threshold Embodiment—FIG. 4"), the operating system displays the message. The data forming the user message may have a conventional raster scan format (in either font mode or graphics mode) for presentation to the user display device.

User display device 10D is responsive to the display message generator for displaying the user message, and may be any suitable computer monitor having a display screen. The user message alerts the user to the present fan working condition, and may be a video user message 10V, still or animated using text (of a selected language) or icons or both. The user message may contain sound for audibly indicating the fan working condition to the user in addition to the video user message displayed on the screen. Further, the display message generator may provide a log-on user message indicating the time elapsed since the last abnormal fan working condition.

ONE THRESHOLD EMBODIMENT—FIG. 2

A single threshold current monitoring circuit (see FIG. 2) includes a voltage developing impedance 23 and a two-state voltage comparator 24C for indicating two fan working conditions (normal and abnormal). The voltage developing impedance may be a simple ohmic resistance (10 ohms 1%/DIP) connected in series with the motor winding for developing a monitored voltage in responsive to the working current therethrough. The fan working condition is reflected in the level of the working current. The voltage comparator is responsive to the monitored voltage across the impedance, and has a stable state for each working condition of the fan. The monitored voltage drifts up or down due to the changing working current required by the fan. The voltage comparator changes state when the voltage drift is sufficiently large to pass a reference voltage threshold. The output of the voltage comparator provides the present fan working condition to display message generator 26.

The basic element of voltage comparator 24C is a differential operating amplifier 24A (U53A), having an inverting input and a non-inverting input. The inverting input is connected to the monitored voltage across developing impedance 23 through current limiting resister 23L (51K ohms). The non-inverting input is connected to reference voltage 24R at the middle node of a voltage divider formed by large resistor 24L (100K ohms) and small resistor 24S (1K ohms). The voltage divider extends between Vcc (plus 12 volts) and ground. Pull-down resistor 24P (10K ohms) connects the output of the amplifier to Vcc. Shunt capacitor 23V (0.1 microfarads) connected to the high voltage side of the motor winding filters noise on Vcc to ground. Another shunt capacitor 23M (0.1 microfarads) connected to the inverting input of the voltage comparator filters the monitored voltage.

Figure 2:
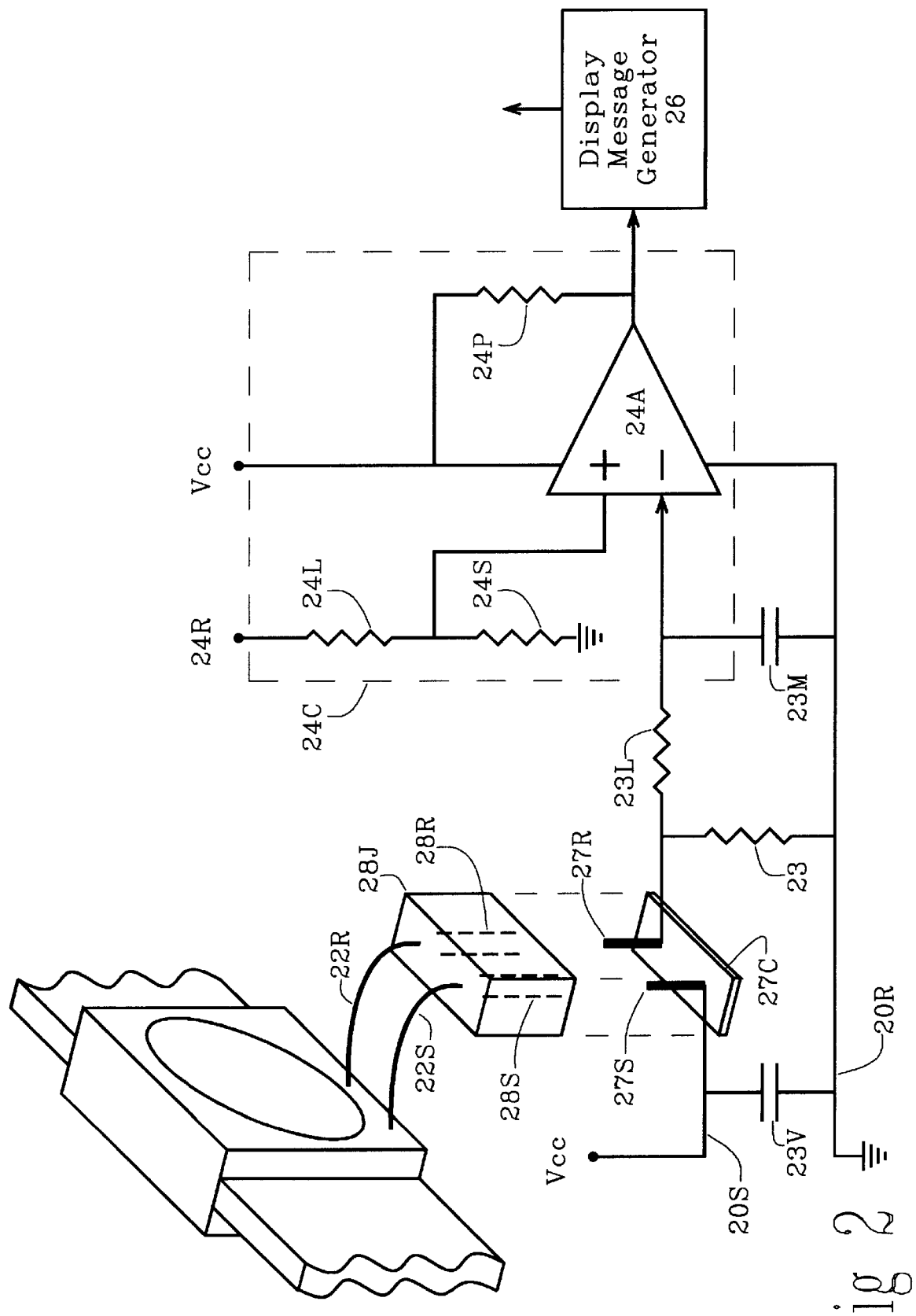
FIG. 2 is a schematic diagram of the current monitoring circuit of FIG. 1 showing a voltage developing impedance and a voltage comparator.

A suitable header device such as two pin mother board connector 27C and jumper block 28J, may mounted between Vcc and the developing impedance to permit easy installation and removal of the fan. In the embodiment of FIG. 2, the fan is a single fan mounted in one of the walls of the housing. The mother board connector has supply pin contact 27S for releasably engaging cooperating sleeve contact 28S in the jumper block. Return pin contact 27R releasably engages sleeve contact 28R.

Supply mother board trace 20S formed on the mother board and extends between the supply terminal of the power supply and the supply pin of the header device. Return mother board trace 20R also formed on the mother board and extends between the return pin and the return terminal of the power supply. Return trace 20R may form part of the ground circuit. Supply lead 22S is connected between the supply sleeve contact and the motor winding. The supply trace and the supply lead are connected in series to supply the working current to the motor winding. Return lead 22R is connected between the motor winding and the return sleeve contact. The return lead and the return trace are connected in series to return the working current to the motor winding. The two mother board traces conduct the working current at the mother board level, and permit access to working current by the mother board components.

The current monitoring circuit is connected between one of the mother board traces and the associated pin contact in the header device. In the embodiment of FIG. 2, the current monitoring circuit is connected between the return pin contact and the return mother board trace. The voltage comparator has a binary output, low when the monitored voltage is greater than the reference voltage, and high when the monitored voltage is less than the reference voltage.

DUAL FAN EMBODIMENT—FIG. 3

Figure 3:
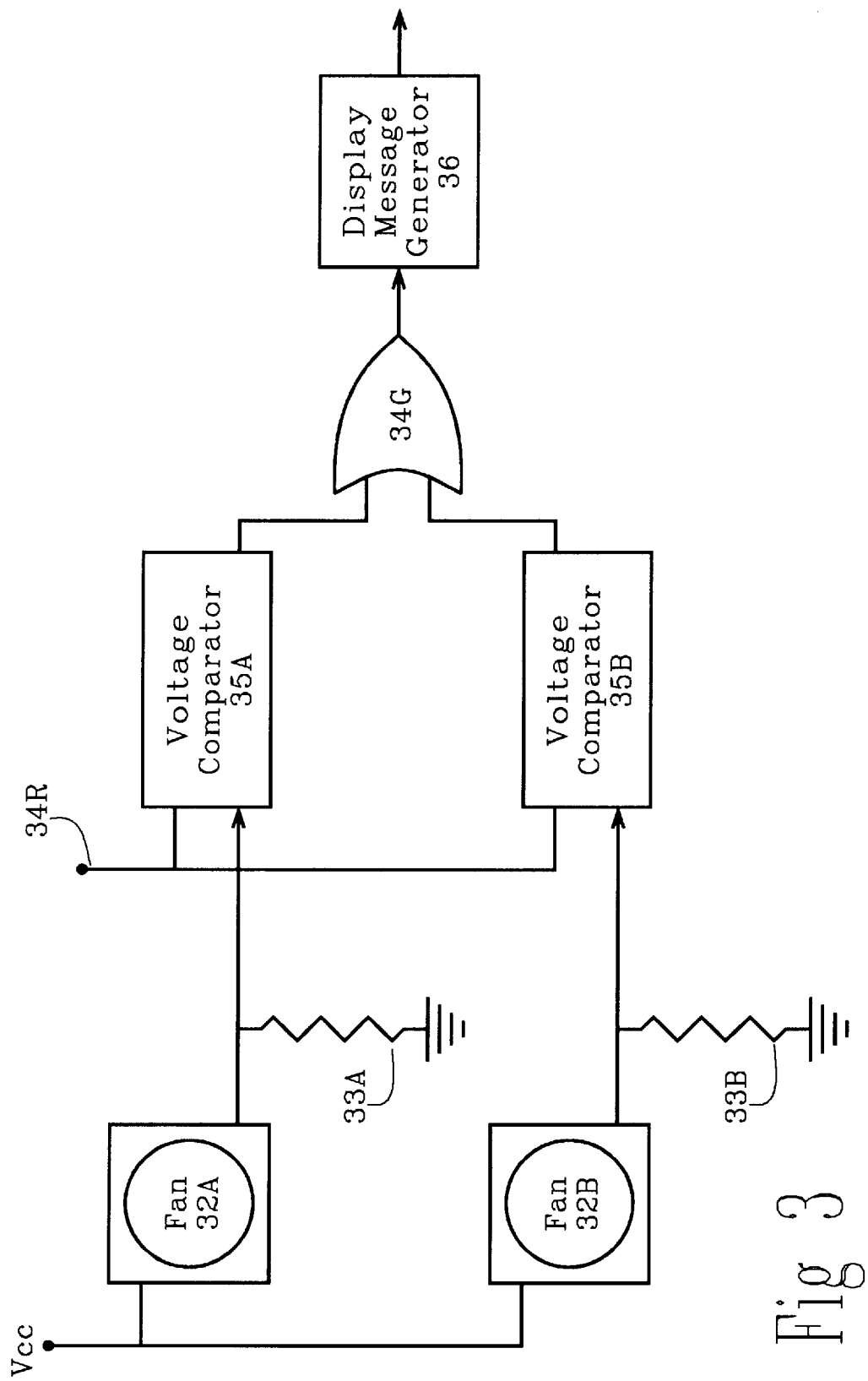
FIG. 3 is a two fan embodiment of the computer apparatus.

A plurality of fans may be employed each having a rotating blade and a motor winding with a working current therethrough. The current monitoring circuit may be a plurality of monitoring circuits one for monitoring the working current through each fan. The embodiment of FIG. 3 shows two fans 32A and 32B each with a developing impedance 33A and 33B and a voltage comparator circuit 35A and 35B. The components and operation of the two comparators may be similar or identical to the components and operation of comparator 24C of FIG. 2. The two comparators compare the monitored voltages across the two impedances 33A and 33B to reference voltage 34R. The outputs of the two comparators are "ORed" by OR gate 34G. Display message generator 36 provides a single user message indicating that at least one fan has a high output. Alternatively, the two outputs may be separate without the OR gate. The display message generator then provides a two of user messages, one for the fan working condition of each fan.

TWO THRESHOLD EMBODIMENT—FIG. 4

A multi-threshold current monitoring circuit may includes multiple reference voltages and a more complex current monitoring circuit having multiple states indicating multiple fan working conditions. In the two threshold embodiment of FIG. 2, working current from a single fan 42 passes through a single developing resistor 43 to provide a monitored voltage to underload voltage comparator 45U and overload voltage comparator 45H. The underload voltage comparator receives underload reference voltage 44U defining an underload fan working condition. Similarly, the overload voltage comparator receives overload reference voltage 44H defining an overload fan working condition. The overload reference voltage is greater than the underload reference voltage. The voltage range between the two reference voltages defines a normal fan working condition. The two voltage comparators compare the monitored voltage with the reference voltages for defining a normal state in which the monitored voltage is within the normal voltage range between the underload reference voltage and the overload reference voltage.

The underload voltage comparator 45U flips from a normal state (output low) to an underload state (output high) when the monitored voltage drifts downwards to a value less than the underload reference voltage. This downward flip indicates that the working current has passed from a normal level corresponding to a normal fan working condition to an underload level corresponding to an underload fan working condition. An underload working current is typically caused by an open in the motor winding (zero current) or a disconnected fan or a low Vcc voltage from an ageing power supply (low current).

The overload voltage comparator 45H flips from a normal state (output low) to an overload state (output high) when the monitored voltage drifts upwards to a value greater than the underload reference voltage. This upward flip indicates that the working current has passed from a normal level corresponding to a normal fan working condition to an overload level corresponding to an overload fan working condition. An overload working current is typically caused by a short in the motor winding or an ageing motor with bearing wear.

The display message generator provides an underload user message when the underload voltage comparator 45U is in the underload state and has a high output. The display message generator provides an overload user message when the overload voltage comparator 45H is in the overload state, and has a high output. The display message generator does not provides a user message when both of the voltage comparators are in the normal state.

INDUSTRIAL APPLICABILITY

It will be apparent to those skilled in the art that the objects of this invention have been achieved by providing a fan current monitoring circuit for determining the fan working condition. The current monitoring circuit determines fan working condition by monitoring the working current and present the fan working condition to the user without interrupting the system function.

CONCLUSION

Clearly various changes may be made in the structure and embodiments shown herein without departing from the concept of the invention. Further, features of the embodiments shown in the various figures may be employed with the embodiments of the other figures.

Therefore, the scope of the invention is to be determined by the terminology of the following claims and the legal equivalents thereof.

We claim as our invention:

1. Computer apparatus which provides fan working conditions to a user display monitor, comprising:

housing means enclosing the computer apparatus;

mother board within the housing for supporting components of the computer apparatus;

fan means having rotating blade means for moving a flow of convective cooling air over the mother board throughout the housing, and having motor winding means which receives working current for causing the blade means to rotate;

power supply means having a supply terminal for supplying the working current to the motor winding means, and having a return terminal for returning the working current from the motor winding means;

voltage developing impedance on the mother board within the housing means for developing a monitored voltage in responsive to the working current; and multi-state comparing means on the mother board within the housing means having a state for each working condition of the fan means, responsive to the monitored voltage of the voltage developing impedance for providing the present fan working condition;

display message means responsive to the present fan working condition from the voltage developing impedance for providing raster scan data forming a user message containing the present fan working condition; and CPU means for operating the computer apparatus, having a multi-task operating system which permits non-disruptive interruptions of system functions in order to present the user message containing the present fan working condition to the user display monitor.

2. The computer apparatus of claim 1, wherein the mother board further comprises:

header connector means mounted on the mother board with a supply header contact and a return header contact;

a supply mother board trace formed on the mother board and extending between the supply terminal of the power supply means and the supply header contact; and a return mother board trace formed on the mother board and extending between the return header contact and the return terminal of the power supply means.

3. The computer apparatus of claim 2, wherein the fan means further comprises:

supply lead connected between the supply header contact and the motor winding means, the supply mother board trace and the supply lead connected in series to supply the working current to the motor winding means; and return lead connected between the motor winding means and the return header contact, the return lead and the return mother board trace connected in series to return the working current to the motor winding means.

4. The computer apparatus of claim 3, wherein the voltage developing impedance is connected between one of the mother board traces and the associated header contact.

5. The computer apparatus of claim 3, wherein the voltage developing impedance is connected between the return mother board trace and the return header contact.

6. The computer apparatus of claim 3, wherein the header connector means is a two pin jumper header connector having a supply pin for releasably connecting to the supply lead and having a return pin for releasably connecting to the return lead.

7. The computer apparatus of claim 1, wherein the voltage developing impedance is an ohmic resistance connected in series with the motor winding means.

8. The computer apparatus of claim 1, further comprising a reference voltage means for providing an underload reference voltage; and wherein the multi-state comparing means compares the monitored voltage with the underload reference voltage for defining a normal state in which the monitored voltage is greater than the underload reference voltage, and an underload state in which the monitored voltage is less than the underload reference voltage, which indicate when the working current has passed from a normal level corresponding to a normal fan working condition to an underload level corresponding to an underload fan working condition.

9. The computer apparatus of claim 8, wherein the display message means provides an underload user message when the comparing means is in the underload state, and no user message when the comparing means is in the normal state.

10. The computer apparatus of claim 1, further comprising a reference voltage means for providing an overload reference voltage; and wherein the multi-state comparing means compares the monitored voltage with the overload reference voltage for defining a normal state in which the monitored voltage is less than the overload reference voltage, and an overload state in which the monitored voltage is greater than the overload reference voltage, which indicates when the working current has passed from a normal level corresponding to a normal fan working condition to an overload level corresponding to an overload fan working condition.

11. The computer apparatus of claim 10, wherein the display message means provides an overload user message when the comparing means is in the overload state, and no user message when the comparing means is in the normal state.

12. The computer apparatus of claim 1, further comprising a reference voltage means for providing an underload reference voltage and an overload reference voltage defining a normal voltage range therebetween; and wherein the multi-state comparing means compares the monitored voltage with the reference voltages for defining a normal state in which the monitored voltage is within the normal voltage range between the underload reference voltage and the overload reference voltage, an underload state in which the monitored voltage is less than the underload reference voltage, an overload state in which the monitored voltage is greater than the overload reference voltage, which indicates when the working current has passed from a normal level corresponding to a normal fan working condition to an underload level corresponding to an underload fan working condition, or from a normal level corresponding to a normal fan working condition to an overload level corresponding to an overload fan working condition.

13. The computer apparatus of claim 12, wherein the display message means provides an underload user message when the comparing means is in the underload state, an overload user message when the comparing means is in the overload state, and no user message when the comparing means is in the normal state.

14. The computer apparatus of claim 1, wherein:

the fan means is a plurality of fans each having a rotating blade and a motor winding with a working current therethrough; and the comparing means is a plurality of comparing means one for monitoring the working current through each fan.

15. The computer apparatus of claim 14, wherein the display message means provides a plurality of user messages, one for the fan working condition of each fan.

16. The computer apparatus of claim 14, wherein the display message means provides a single user message indicating that at least one fan has an abnormal fan working condition.

17. The computer apparatus of claim 1, wherein the housing means is formed by side walls, and the fan means is a single fan mounted in one of the walls of the housing means.

18. The computer apparatus of claim 1, wherein the CPU means includes a CPU chip, and the fan means is a single fan mounted on the CPU chip.

19. The computer apparatus of claim 1, wherein the computer apparatus further comprises a display monitor means responsive to the display message means for displaying the user messages.

20. The computer apparatus of claim 1, wherein the operating system polls the display message means at predetermined intervals for capturing the present fan working condition.

21. The computer apparatus of claim 1, wherein the display message means provides a log-on user message indicating the time elapsed since the last abnormal fan working condition.

22. The computer apparatus of claim 19, wherein the display message means provides an audio user message indicating the fan working condition in addition to the displayed user message.

* * * * *